Sept. 22, 1964 H. PIPPING 3,150,297
LEAD WIRE CONNECTION FOR SEMICONDUCTOR DEVICE
Filed April 21, 1959
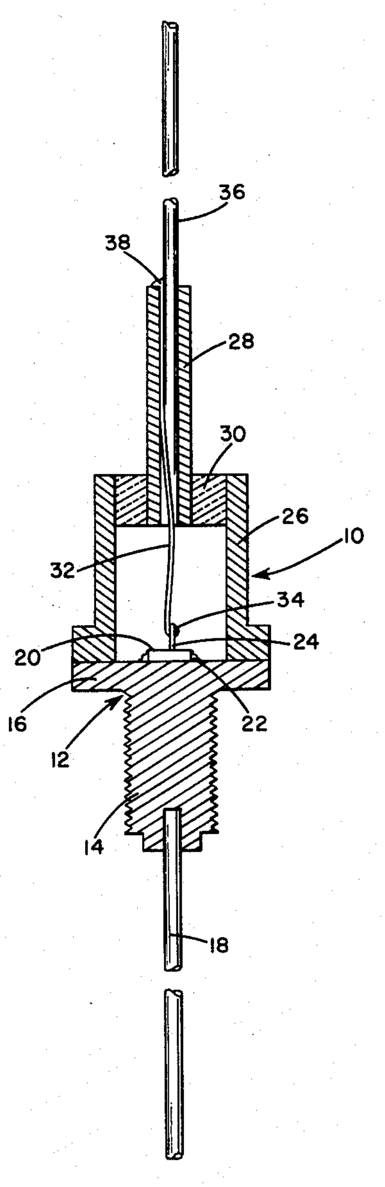
INVENTOR.
HEINZ PIPPING
BY
ATTORNEY United States Patent Office 3,150,297
Patented Sept. 22, 1964

3,150,297

LEAD WIRE CONNECTION FOR SEMICONDUCTOR DEVICE

Heinz Pipping, Dusseldorf, Germany, assignor to Clevite Corporation, Cleveland, Ohio, a corporation of Ohio Filed Apr. 21, 1959, Ser. No. 807,808
Claims priority, application Germany, Apr. 24, 1958, I 14,740
5 Claims. (Cl. 317—234)

This invention relates to semiconductor devices, particularly to hermetically-enclosed, aluminum-alloyed silicon devices and methods of their construction.

For sake of example, the invention will be described as applied to an aluminum-alloyed silicon power diode. As is well known such a diode consists of a silicon wafer having one major surface soldered to a conductive support such as a copper pedestal and having a short stub of aluminum or doped aluminum wire projecting from the other major surface. Usually the entire assembly is enclosed in a suitable, sealed housing with individual terminal lead wires connected to each surface of the wafer via the copper pedestal and the aluminum wire stub. Connecting a terminal lead wire, usually of copper, to the copper pedestal of course presents no problem. Not so the connection of the aluminum wire stub. Heretofore it has been the practice to connect a terminal lead wire to the aluminum wire stub by crimping or other mechanical joining technique. Such a mechanical connection, however, is unsatisfactory because, despite the hermetic sealing of the device, the aluminum wire eventually oxidizes. This leads to progressive deterioration of the contact and, eventually, in many cases, to its complete disruption.

It is a fundamental object of the present invention to overcome the problem of making durable and otherwise satisfactory terminal lead wire connections to semiconductor devices.

This and further objects are accomplished by a method of applying a terminal lead wire to a semiconductor device including a silicon wafer and a short aluminum wire stub, which method, in accordance with the invention, comprises welding a short length of copper wire to the aluminum wire and then soldering a terminal lead wire to the copper wire.

In accordance with another feature of the invention, a semiconductor device comprises a housing having an electrically conductive portion at one end and, at the other end, a tubular extension electrically insulated from said conductive portion. A wafer of semiconductive material in the housing is secured in electrical contact with the electrically conductive portion thereof. A relatively short wire stub projects from the wafer and a connecting wire has one end welded to the wire stub and the other end disposed in the tubular extension. A terminal lead wire extends into the tubular extension from without the housing and a solder bond couples the lead wire and connection wire within the tubular extension.

Additional objects of the invention, its advantages, scope and the manner in which it may be practiced will be apparent to those conversant with the art from the following description and subjoined claims taken with the annexed drawing, in which, the single figure is an axial section of a power diode according to the invention.

The power diode comprises a generally tubular housing 10 having an electrically conductive portion 12 at one end. Typically housing portion 12 may consist of a copper mounting stud or pedestal having a thread shank 14 and a flat head 16. A copper terminal lead wire 18 extends from the end of shank 14 remote from head 16. An aluminum-alloyed silicon wafer 20 is disposed in the region of the center of head 16 with one major surface in electrical contact therewith and secured in this position as by soldering at 22. An aluminum or aluminum alloy wire stub 24 projects from the other major surface of wafer 20 forming a rectifying junction therewith.

Housing 10 in addition to mounting stud 12, comprises a generally tubular sidewall 26 coaxially secured at one end to head 16 of the mounting stud. At the opposite end of sidewall 26 is a coaxial tubular metal extension or lead wire "pass-through" 28 bonded and sealed to the sidewall by a fused glass annulus 30 which also serves to insulate electrically the extension from the stud 12 as well as the remainder of housing 10.

One end of a connecting copper wire 32 is welded as at 34 to one end of aluminum wire stub 24. The other end of connecting wire 32 extends well into or through tubular extension 28. A copper terminal lead wire 36 extends into extension 28.

A solder bond 38 at the end of extension 28 joins the associated ends of wires 32 and 36 and at the same time hermetically seals off the extension.

While the precise general method of assembling the device would vary with the particular construction and preferred fabrication techniques, the connection of lead wire 36 to wire stub 24 is accomplished by welding connection wire 32 to the stub, preferably by means of a spot welder, passing the connection wire through tubular extension 28, inserting the lead wire into the outer end of the tubular extension, and then applying solder bond 38.

The foregoing description designates certain elements of the device as being of copper or aluminum; it is to be understood that these designations are made in a general sense and included, respectively, copper alloys and aluminum alloys, as well as other metals which may be compatible with essential concepts of the invention.

Lead wire connections as described above, aside from providing a durable contact of optimum conductivity have a further advantage, viz., the thermal stresses induced in the diode are compensated by the elasticity of the copper connecting wire 32.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

I claim:

1. A semiconductor device comprising a housing having an electrically conductive portion at one end and, at the other end, a tubular extension electrically insulated from said conductive portion; a wafer of semiconductive material in said housing secured in electrical contact with said conductive portion thereof; a relatively short wire stub forming a rectifying junction with said wafer and projecting therefrom; a connecting wire having one end welded to said wire stub and the other end disposed in said tubular extension; a terminal lead wire extending into said tubular extension from without said housing; and a solder bond coupling said lead wire and connection wire and sealing said wires in said tubular extension.

2. A semiconductor device comprising a housing having an electrically conductive portion at one end and, at the other end, a tubular extension electrically insulated from said conductive portion; a wafer of aluminum-alloyed silicon in said housing soldered to said conductive portion thereof; a relatively short aluminum wire stub forming a rectifying junction with said wafer and projecting therefrom; a copper connecting wire having one end welded to said wire stub and the other end disposed in said tubular extension; a terminal lead wire extending into said tubular extension from without said housing; and a solder bond coupling said lead wire and connection wire and sealing said wires in said tubular extension.

3. A semiconductor device comprising a housing having an electrically conductive portion at one end and, at the other end, a tubular extension electrically insulated from said conductive portion; an aluminum-alloyed silicon wafer in said housing having one major surface in electrical contact with said conductive portion thereof; a relatively short aluminum wire stub forming a rectifying junction with said wafer and projecting from the opposite major surface of said wafer; a copper connecting wire having one end welded to said aluminum wire stub and the other end disposed in said tubular extension; a copper terminal lead wire extending into said tubular extension from without said housing; and a solder bond coupling said lead wire and connection wire and sealing said wires in said tubular extension.

4. A semiconductor diode comprising a generally tubular housing having an electrically conductive portion at one end and, at the other end, a coaxial tubular extension electrically insulated from said conductive portion; an aluminum-alloyed silicon wafer coaxially disposed within said housing and soldered with one major surface in electrical contact with said conductive portion thereof; a relatively short aluminum wire stub forming a rectifying junction with said wafer and projecting from the opposite major surface of said wafer; a copper connecting wire having one end welded to said wire stub and the other end extending through said tubular extension; a copper terminal lead wire extending into said tubular extension from without said housing; and a solder bond coupling said lead wire and connection wire and hermetically sealing said wires in said tubular extension.

5. A method of applying a terminal lead wire to a semiconductor device including an aluminum-alloyed silicon wafer having a short aluminum wire stub forming a rectifying junction with the wafer and projecting therefrom, said wafer being fixed within a housing having a tubular extension for the insertion of such a lead wire, said method comprising: welding to said wire stub one end of a copper wire the other end of which extends into and terminates within said extension; inserting a terminal lead wire into said extension from without said housing; and applying solder to said extension so as to connect said copper wire and lead wire and seal off said extension.

References Cited in the file of this patent

UNITED STATES PATENTS

| | | |
|---|---|---|
| 2,744,218 | Burton | May 1, 1956 |
| 2,783,418 | Peter | Feb. 26, 1957 |
| 2,853,661 | Houle et al. | Sept. 23, 1958 |
| 2,861,230 | Le Loup | Nov. 18, 1958 |
| 2,866,929 | Cooper | Dec. 30, 1958 |
| 2,898,668 | Knott et al. | Aug. 11, 1959 |